United States Patent
Iizuka et al.

(10) Patent No.: US 7,513,954 B2
(45) Date of Patent: Apr. 7, 2009

(54) PLASMA PROCESSING APPARATUS AND SUBSTRATE MOUNTING TABLE EMPLOYED THEREIN

(75) Inventors: Hachishiro Iizuka, Nirasaki (JP); Taro Ikeda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 10/484,430

(22) PCT Filed: Jul. 24, 2002

(86) PCT No.: PCT/JP02/07507

§ 371 (c)(1),
(2), (4) Date: Jan. 27, 2004

(87) PCT Pub. No.: WO03/010809

PCT Pub. Date: Feb. 6, 2003

(65) Prior Publication Data

US 2004/0163762 A1 Aug. 26, 2004

(30) Foreign Application Priority Data

Jul. 27, 2001 (JP) ............................. 2001-227649
Jul. 8, 2002 (JP) ............................. 2002-199102

(51) Int. Cl.
*C23C 16/00* (2006.01)
*C23F 1/00* (2006.01)
*H01L 21/306* (2006.01)

(52) U.S. Cl. ........................ 118/728; 118/729; 118/730; 118/723 E; 156/345.51; 156/345.52; 156/345.53; 156/345.54; 156/345.55; 156/345.43; 156/345.44; 156/345.45; 156/345.47; 156/345.48

(58) Field of Classification Search ............ 156/345.28, 156/345.3, 345.45
See application file for complete search history.

(56) References Cited

U.S. PATENT DOCUMENTS

| 4,622,094 A | * | 11/1986 | Otsubo ....................... 216/61 |
| 5,415,718 A | | 5/1995 | Ohmi et al. |
| 5,665,166 A | * | 9/1997 | Deguchi et al. .......... 118/723 E |
| 5,688,358 A | * | 11/1997 | Tanaka et al. .......... 156/345.48 |
| 5,868,848 A | * | 2/1999 | Tsukamoto ............. 118/723 E |
| 6,297,165 B1 | | 10/2001 | Okumura et al. |

(Continued)

FOREIGN PATENT DOCUMENTS

JP 6232088 8/1994

(Continued)

*Primary Examiner*—Parviz Hassanzadeh
*Assistant Examiner*—Rakesh K Dhingra
(74) *Attorney, Agent, or Firm*—Oblon, Spivak, McClelland, Maier & Neustadt, P.C.

(57) ABSTRACT

A plasma processing apparatus includes a processing container for receiving a substrate to be processed and processing the substrate by a plasma of a processing gas, a substrate mounting table, installed in the processing container, for mounting the substrate thereon, and a gas supplying unit for supplying the processing gas into the processing container. Here, the substrate mounting table includes a mounting table main body formed of an insulator component. Here, an electrode is embedded inside the mounting table main body, a high frequency power supply for supplying a high frequency power is connected to the electrode, and one or more exposed electrodes are installed to be exposed toward the outside of the mounting table main body and electrically connected to the electrode in the mounting table main body.

24 Claims, 12 Drawing Sheets

U.S. PATENT DOCUMENTS

| | | | |
|---|---|---|---|
| 6,409,896 B2 * | 6/2002 | Crocker | 204/298.03 |
| 6,458,239 B1 * | 10/2002 | Bhardwaj et al. | 156/345.24 |
| 6,494,958 B1 * | 12/2002 | Shamouilian et al. | 118/728 |
| 6,521,292 B1 * | 2/2003 | Yudovsky et al. | 427/248.1 |
| 6,551,447 B1 * | 4/2003 | Savas et al. | 156/345.48 |
| 6,676,804 B1 * | 1/2004 | Koshimizu et al. | 156/345.53 |
| 6,716,301 B2 * | 4/2004 | Kanno et al. | 156/345.28 |
| 2001/0029895 A1 * | 10/2001 | Hanamachi et al. | 118/725 |
| 2001/0032707 A1 * | 10/2001 | Sango | 156/345 |
| 2001/0054381 A1 * | 12/2001 | Umotoy et al. | 118/715 |

FOREIGN PATENT DOCUMENTS

| | | |
|---|---|---|
| JP | 09-23795 | 1/1997 |
| JP | 09-027395 | 1/1997 |
| JP | 2000-164712 | 6/2000 |

* cited by examiner

PLASMA PROCESSING APPARATUS AND SUBSTRATE MOUNTING TABLE EMPLOYED THEREIN

FIELD OF THE INVENTION

The present invention relates to a plasma processing apparatus and a substrate mounting table employed therein.

BACKGROUND OF THE INVENTION

In a manufacturing process of a semiconductor device, a plasma processing apparatus is used to perform a predetermined processing such as etching and/or CVD film formation on a semiconductor wafer to be processed (hereinafter referred to as a wafer) by using a plasma. In such plasma processing apparatus, the wafer is mounted on a mounting table or a lower electrode installed in a plasma processing container in vacuum, a plasma is generated in the processing container and a predetermined plasma processing is executed on a surface of the wafer by the plasma.

There has been known a scheme that by applying a high frequency power to the mounting table on which the wafer is mounted or to a lower electrode embedded therein, negative self-bias voltage ($V_{DC}$) is generated at the mounting table or the lower electrode, and ions in the plasma are attracted toward the wafer by the self-bias voltage to thereby accelerate the plasma processing. In this case, the self-bias voltage largely influences an incidence angle and an energy of the ions impinging onto the wafer. While performing a plasma etching process, for example, an excessively high self-bias voltage causes the surface of the wafer to be damaged, whereas an excessively low self-bias voltage causes reactions of the ions to be insufficient. Thus, in order to perform a proper plasma processing, it is preferable to detect the self-bias voltage during the plasma processing to adjust a magnitude of the self-bias voltage.

In Japanese Patent Laid-open Publication No. 1996-335567, there is disclosed a scheme in which there are provided a lower electrode for mounting a wafer thereron and a measuring electrode disposed around the wafer and connected to the lower electrode; and the self-bias voltage is measured at a power supply path through which a high frequency power is applied to the lower electrode.

However, when using a mounting table wherein a surface of the electrode to which a high frequency voltage is applied is covered by an insulator, it becomes inappropriate to measure, as in the Japanese Patent Laid-open Publication No. 1996-335567, the self-bias voltage at the power supply path of the electrode to which the high frequency power is applied, and the self-bias voltage is not detected until the electrode is exposed to the plasma, e.g., through cracks which may be generated in the insulator. Therefore, the self-bias voltage is merely interlockingly used only to indicate a presence of cracks in the insulator in case of using such a mounting table.

SUMMARY OF THE INVENTION

It is, therefore, a primary object of the present invention to provide a plasma processing apparatus capable of measuring a self-bias voltage of a high frequency electrode during the plasma processing process while using a mounting table of a structure in which a surface thereof is coated with an insulator. Further, it is another object of the present invention to provide a substrate mounting table whose surface is coated with an insulator and capable of measuring a self-bias voltage of a high frequency electrode during a plasma processing process.

In accordance with the present invention, there is provided a plasma processing apparatus comprising:

a processing container for receiving a substrate to be processed and processing the substrate by a plasma of a processing gas;

a substrate mounting table, installed in the processing container, for mounting the substrate thereon, the substrate mounting table including a mounting table main body formed of an insulator component;

a gas supplying unit for supplying the processing gas into the processing container;

a high frequency electrode installed at the substrate mounting table;

a high frequency power supply, connected to the high frequency electrode of the substrate mounting table, for supplying a high frequency power; and one or more exposed electrodes installed in the substrate mounting table to be exposed therethrough and connected to the high frequency electrode.

The plasma processing apparatus of the present invention may further include a self-bias voltage measuring circuit for measuring a self-bias voltage of the plasma from a current flowing from the plasma formed in the processing container via the exposed electrodes.

The plasma processing apparatus of the present invention may further include:

an antenna, disposed outside the processing container, for forming an induced electromagnetic field within the processing container; and a high frequency power supply for plasma for supplying a high frequency power to the antenna.

In the plasma processing apparatus of the present invention, surfaces of the exposed electrodes may be leveled with or lower than a surface of the insulator component.

In the plasma processing apparatus of the present invention, the exposed electrodes may be made of one of Ti, SiC, W, Co, Cu, Ni, Mo and Ta.

In the plasma processing apparatus of the present invention, the exposed electrodes may be disposed outside a periphery of the substrate mounted on the substrate mounting table.

In the plasma processing apparatus of the present invention, the exposed electrodes may be installed at plural locations to be nearly equi-distanced along a circle substantially concentric with respect to the substrate mounted on the substrate mounting table.

The plasma processing apparatus of the present invention may further include a heating unit, disposed in the substrate mounting table, for heating the substrate mounted on the substrate mounting table.

In the plasma processing apparatus of the present invention, the high frequency electrode and the heating unit may be embedded in the mounting table main body formed of the insulator component.

The plasma processing apparatus of the present invention may include detachably installed measuring jigs, each jig including a conductor for contacting one of the exposed electrodes and the substrate mounted on the mounting table main body and a protection cover for protecting the conductor, wherein the self-bias voltage measuring circuit measures the self-bias voltage of the plasma from the current flowing from the plasma formed in the processing container via the conductor and the exposed electrodes.

In the plasma processing apparatus of the present invention, each of the exposed electrodes may be installed in a hole of the mounting table main body and has a crest wider than the hole at the outside thereof.

In accordance with the present invention, there is provided a substrate mounting table for mounting a substrate to be processed while performing a plasma processing thereon, comprising:

a mounting table main body made of an insulator component;

a high frequency electrode, installed to the mounting table main body, to which high frequency power is applied; and one or more exposed electrodes installed in the mounting table main body to be exposed therethrough and connected to the high frequency electrode.

In accordance with the present invention of the above described configuration, since there is provided the exposed electrode connected to the high frequency electrode and installed to be exposed, the exposed electrode is brought into a contact with the plasma while performing the plasma processing process on the substrate to be processed mounted on the substrate mounting table whose surface is made of an insulator, so that the self-bias voltage of the high frequency electrode can be measured. Specifically, by providing the self-bias voltage measurement circuit for measuring the self-bias voltage of the high frequency electrode from the current flowing from the plasma generated in the processing container via the exposed electrode, the self-bias voltage of the high frequency electrode can be measured from the current flowing from the plasma via the exposed electrode.

In the present invention, there is further provided a attachable and detachable measuring jig which includes a conductor for connecting the exposed electrode to an upper location of the substrate mounted on the substrate mounting table and a protection cover for protecting the conductor. Since the self-bias voltage measurement circuit measures the self-bias voltage of the high frequency electrode from the current flowing from the plasma generated in the processing container via the conductor and the exposed electrode, the self-bias voltage can be measured from the plasma existing at a position of the substrate to be processed. Consequently, the measurement accuracy can be further increased and the measured self-bias voltage can be used as a standard of the self-bias voltage.

Moreover, the exposed electrode can be exposed at any location in the processing container; but it is preferable that the exposed electrode is disposed around the substrate, and the top surface of the exposed electrode is level with or lower than that of the mounting table in order to prevent the substrate from being damaged by the plasma. Particularly, it is more preferable that the top surface of the exposed electrode is to be lower than that of the mounting table. In such case, the concentration of the sputtering on the exposed electrode can be prevented during the plasma processing.

Further, the exposed electrode is preferably made of one of Ti, SiC, W, Co, Cu, Ni, Mo and Ta. For instance, in case a film containing any one of Ti, W, Co, Cu, Ni, Mo and Ta is formed in a subsequent process, the exposed electrode is preferably made of a metal identical to that of the subsequent film formation process so that an adverse effect such as impurity contamination of the substrate caused by sputtering of the exposed electrode can be reduced. Further, in case the exposed electrode is made of SiC, Si may be sputtered; but, if a silicon wafer is used as a substrate to be processed, such Si sputtering does not cause serious problems, since the sputtered Si is deposited on the silicon wafer.

Furthermore, it is preferable that the exposed electrode is disposed outside the outer periphery of the substrate mounted on the substrate mounting table. Further, it is preferable that a plurality of exposed electrodes are disposed to be equi-distanced at locations along a circle concentric with respect to the substrate mounted on the substrate mounting table, at plural positions. By this, the in-surface non-uniformity in the processing of the substrate to be processed due to the presence of the exposed electrodes can be prevented. Further, the exposed electrode is preferably disposed on the upper surface of the mounting table on which the substrate to be processed is mounted, but, not limited thereto. The exposed electrodes may be installed on any positions, e.g., the side surface or the lower surface of the mounting table, as long as the self-bias voltage of the high frequency electrode can be measured.

It is also preferable that the substrate mounting table further includes a heating unit, whose surface is coated with an insulator, for heating the substrate to be processed mounted on the substrate mounting table. The heating unit and the high frequency electrode can be embedded in the insulator component.

DETAILED DESCRIPTION OF THE PREFERRED EMBODIMENT

The preferred embodiments of the present invention will be described in detail with reference to the accompanying drawings.

Figure 1:
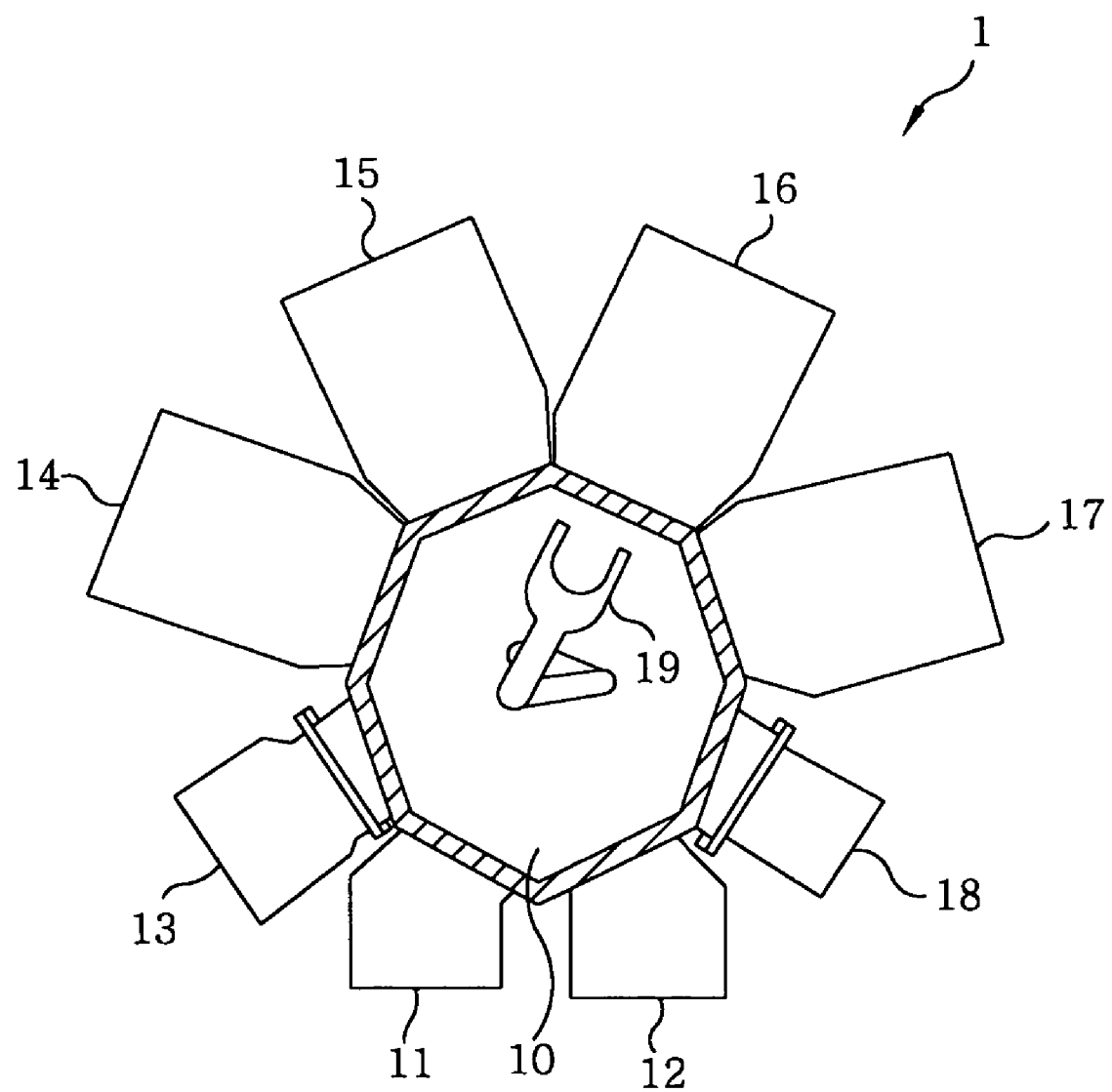
FIG. 1 is a schematic diagram showing a metal film formation system including a pre-cleaning device employing therein a plasma processing apparatus in accordance with the present invention.

FIG. 1 is a schematic diagram illustrating a metal film formation system having a pre-cleaning device in accordance with a preferred embodiment of the present invention. The metal film formation system 1 is a multi-chamber type system in which a transfer chamber 10 is provided in a center thereof; and two cassette chambers 11, 12, a degassing chamber 13, a Ti film formation device 14, a pre-cleaning device 15 in accordance with the preferred embodiment of the present invention, a TiN film formation device 16, an Al film formation device 17 and a cooling chamber 18 are disposed around the transfer chamber 10.

In the metal film formation system 1, a barrier layer is formed on a semiconductor wafer (hereinafter referred to as a wafer) W with contact holes or via holes formed therein, and which are then filled with Al so that an Al layer is formed on the barrier layer to form an Al wiring. Specifically, a transfer arm 19 draws a wafer W from the cassette chamber 11 and loads same into the pre-cleaning device 15, in which the wafer W is etched to remove the native oxide film formed on the surface thereof. Next, the wafer W is transferred into the degassing chamber 13 by the transfer arm 19 and a degassing process is executed on the wafer. Thereafter, a barrier layer is formed by transferring the wafer W to the Ti film formation device 14 and TiN film formation device 16 to form a Ti film and a TiN film, respectively. Finally, an Al layer is formed on the thus processed wafer W by the Al film formation device 17 so that a predetermined film formation process is completed. Thereafter, the wafer W is cooled in the cooling chamber 18 and loaded into the cassette chamber 12.

By the above process, for example, a device having a barrier layer formed on an impurity-diffusion area and an interlayer insulating film and a metal layer formed on the barrier layer to be electrically connected to the impurity-diffusion area is fabricated on the wafer W in which the interlayer insulating film is patterned to form the contact hole extending to the impurity diffusion area.

Figure 2:
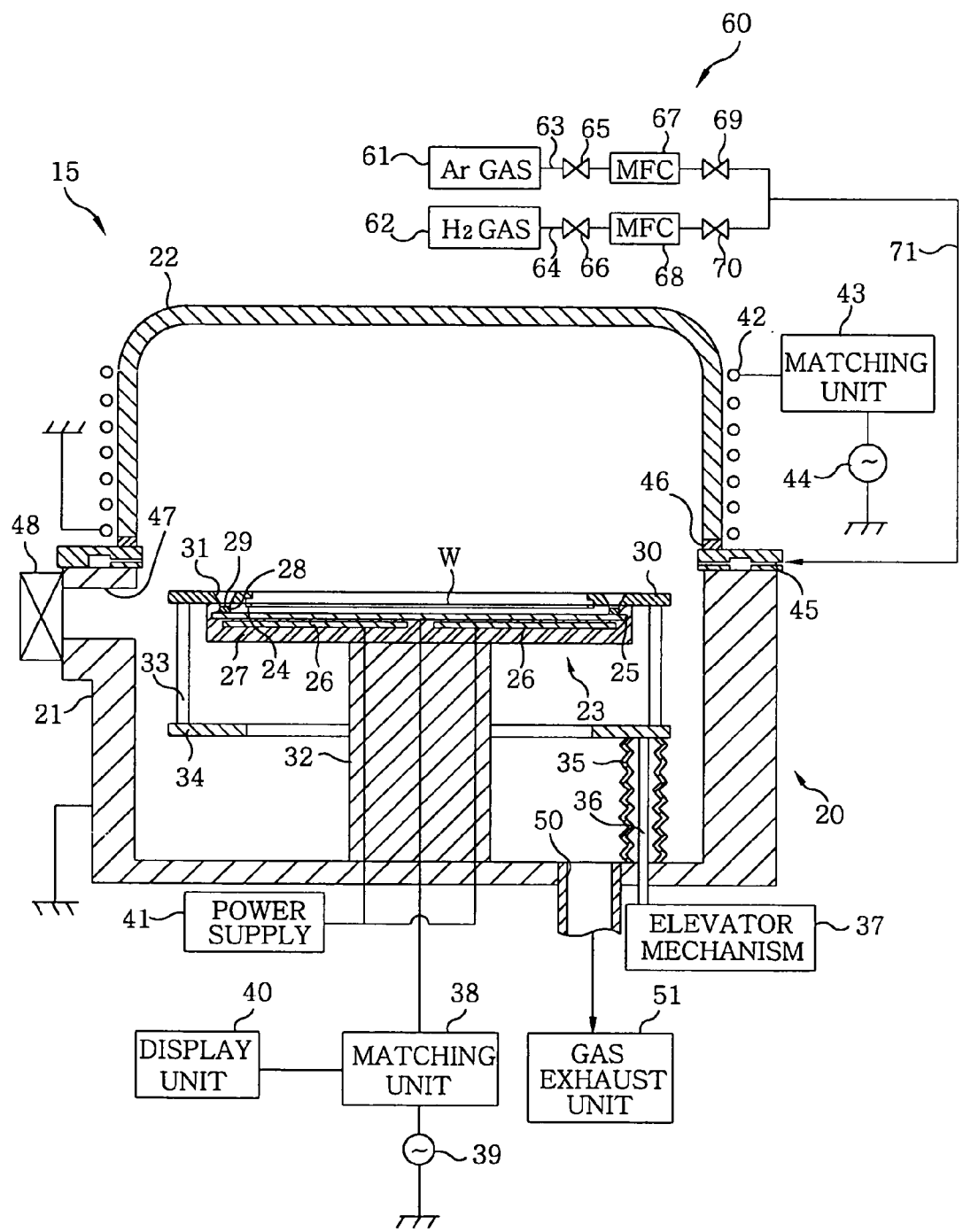
FIG. 2 shows a schematic cross sectional view of the pre-cleaning device illustrated in FIG. 1.

Hereinafter, the pre-cleaning device 15 employed in the metal film formation system 1 in accordance with the first preferred embodiment of the present invention will be described in detail. FIG. 2 is a schematic cross sectional view of the pre-cleaning device 15. As shown in FIG. 2, the pre-cleaning device 15 is provided with a processing container 20, which includes a cylindrical chamber 21 having a base and an opened upper portion and a cylindrical bell jar 22 having a cover continuously installed above the chamber 21 via a gas supply inlet 45 and a gasket 46 to be described later.

In the chamber 21, there is provided a susceptor (a substrate mounting table) 23, supported by a supporting member 32 of a cylindrical shape, to horizontally support the wafer W, i.e., an object to be processed, on an upper portion thereof. The susceptor 23 includes a susceptor main body (mounting table main body) 27 made of an insulator such as a ceramic, e.g., AlN and $Al_2O_3$; and a lower electrode 25 for applying a bias voltage and a heating unit 26 made of W, Mo or the like, both being embedded therein. The susceptor main body 27 and the heating unit 26 constitute a ceramic heater. The heating unit 26 is connected to a DC power supply 41 so that a power can be applied from the DC power supply 41 to heat the heating unit 26 to thereby heat the wafer W to a predetermined temperature.

On an upper part of the susceptor 23, an annular shadow ring 30 made of a dielectric material such as quartz or AlN is installed in such a manner to cover an edge of the wafer W mounted on the susceptor 23. The shadow ring 30 is attached to an annular member 34 via a supporting pillar 33 connected at a bottom surface of the shadow ring 30, and the annular member 34 is connected to an elevator mechanism 37 via a connection member 36. By raising and lowering the connection member 36 by the elevator mechanism 37, the annular member 34, the supporting pillar 33 and the shadow ring 30 can be raised and lowered in union. Further, the connection member 36 is wrapped with a bellows 35, which prevents the atmosphere in the processing container 20 from escaping to the outside via a region around the connection member 36. The shadow ring 30 masks the edge of the wafer W, and at the same time, functions as a focus ring for concentrating a plasma to the wafer W by covering the outer peripheral portion of the wafer W with a dielectric material, to obtain a plasma of a uniform density on the surface of the wafer W. The shadow ring 30 is moved up to a predetermined height while the wafer W carried into the chamber 21 is loaded on vertically moving wafer supporting pins (not shown) through the susceptor 23 and is moved down along with the wafer supporting pins when the wafer W loaded on the wafer supporting pins is mounted onto the susceptor 23.

Installed between the chamber 21 and the bell jar 22 is the annular gas supply unit 45 and the gasket 46. A gas supplied from a gas supplying unit 60 is supplied into the processing container 20 through gas inlet holes formed along an entire inner periphery of the gas supply unit 45. The gas supplying unit 60 includes an Ar gas feed source 61 supplying an Ar gas and a $H_2$ gas feed source 62 supplying a $H_2$ gas. Connected to the Ar gas feed source 61 is a gas supply line 63, on which a mass flow controller 67 and opening/closing valves 65, 69 disposed at both sides thereof are installed. Further, connected to the $H_2$ gas feed source 62 is a gas supply line 64, on which a mass flow controller 68 with opening/closing valves 66, 70 placed at both sides thereof are installed. The gas supply lines 63, 64 are connected to a gas supply line 71 connected to the gas supply unit 45.

The bell jar 22 is made of an electrically insulating material, e.g., quartz or a ceramic material, and is wound with a coil 42 for generating a plasma. A high frequency power supply 44 with a frequency of, e.g., 450 kHz, is connected to the coil 42 via a matching unit 43, and feeds a high frequency power to the coil 42 via the matching unit 43 to generate an induced electromagnetic field within the bell jar 22 through the electrically insulating material, thereby generating a plasma of the gas supplied from the gas supplying unit 60.

Figure 3:
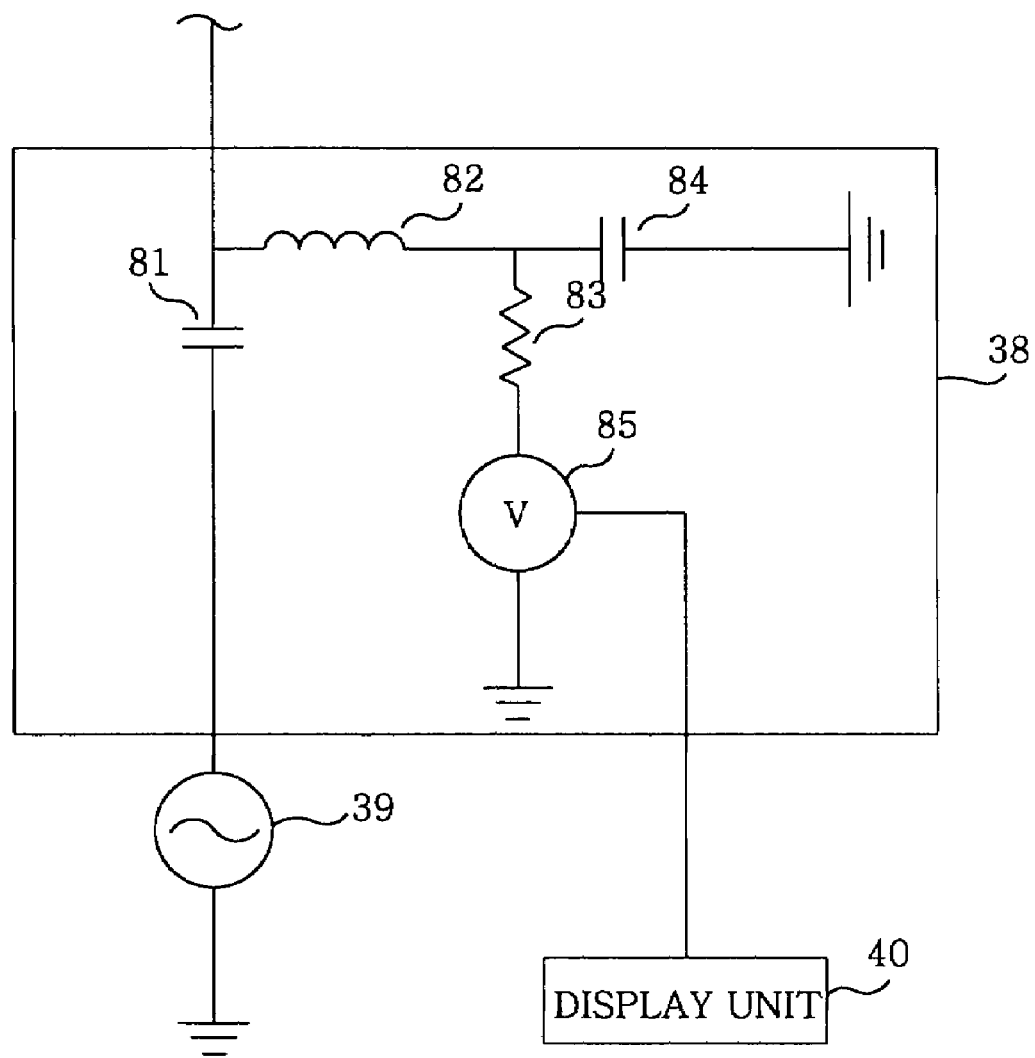
FIG. 3 illustrates a circuit diagram of an exemplary circuit of a matching unit shown in FIG. 2.

Connected to the lower electrode 25 via a matching unit 38 is a high frequency power supply 39 with a frequency of, e.g., 13.56 kHz. After generating the plasma as described above, a high frequency power is applied from the high frequency power supply 39 to the lower electrode 25 and then a self-bias voltage is generated at the lower electrode and, therefore, ions are impinging onto the wafer W. FIG. 3 is a circuit diagram of the matching unit 38. The matching unit 38 includes a blocking capacitor 81, located between the lower electrode 25 and the high frequency power supply 39, for causing the lower electrode 25 to be a floating potential; a coil 82 for extracting a DC current component from a current from the lower electrode 25, wherein one end of the coil 82 is connected to a lower electrode side of the blocking capacitor 81; a resistor 83 and a capacitor 84 which are both connected to the other end of the coil 82; and a voltmeter 85 connected to the resistor 83. The other end of the capacitor 84 is grounded. Under such configuration, the matching unit 38 provides the high frequency power from the high frequency power supply 39 to the lower electrode 25 via the blocking capacitor 81; and at the same time the voltage of the DC current contained in the current from the lower electrode 25 is measured by the voltmeter 85 and the measurement result is outputted to a display unit 40.

Connected to a bottom wall of the chamber 21 is a gas exhaust pipe 50 which is connected to a gas exhaust unit 51 incorporating a vacuum pump therein. By operating the gas exhaust unit 51, the processing container 20 can be held at a predetermined vacuum level.

Furthermore, the chamber 21 is provided with an opening 47 on a sidewall thereof, and a gate valve 48 is installed at a position corresponding to the opening 47 at the outside of the chamber 21. The wafer W is transferred between a neighboring load-lock chamber (not shown) and the chamber 21 while the gate valve 48 is opened.

Figure 4:
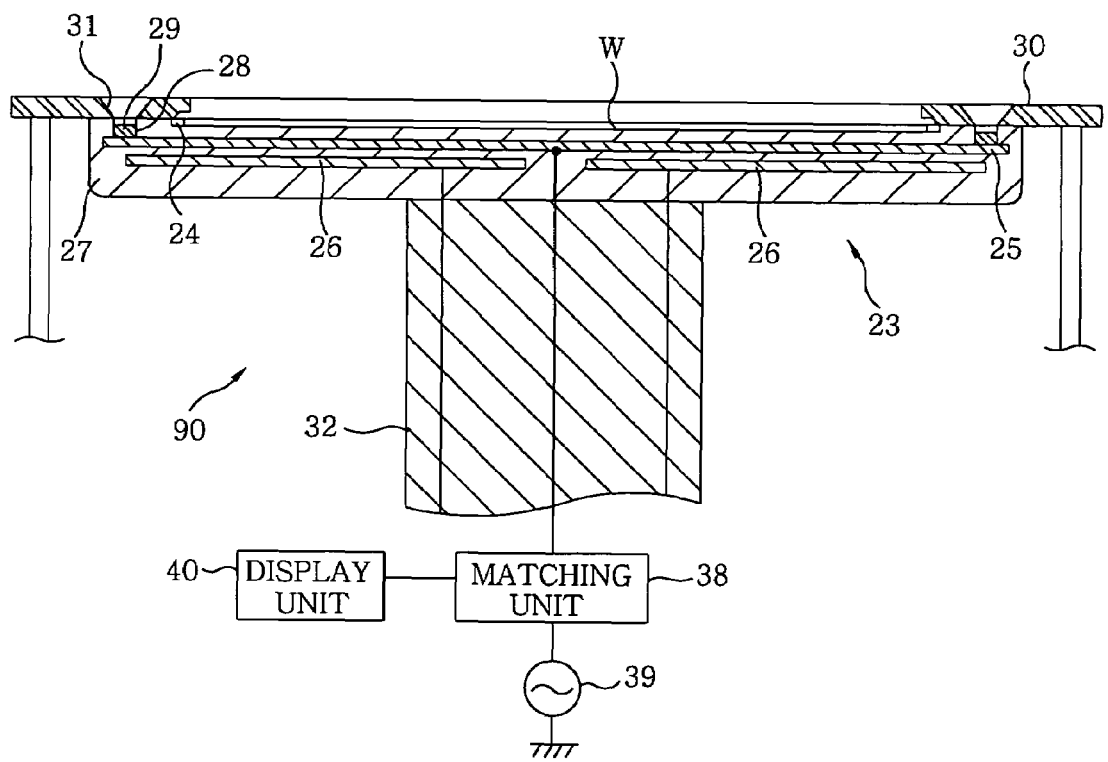
FIG. 4 describes a cross sectional view of a susceptor shown in FIG. 2 and its proximity.
Figure 5:
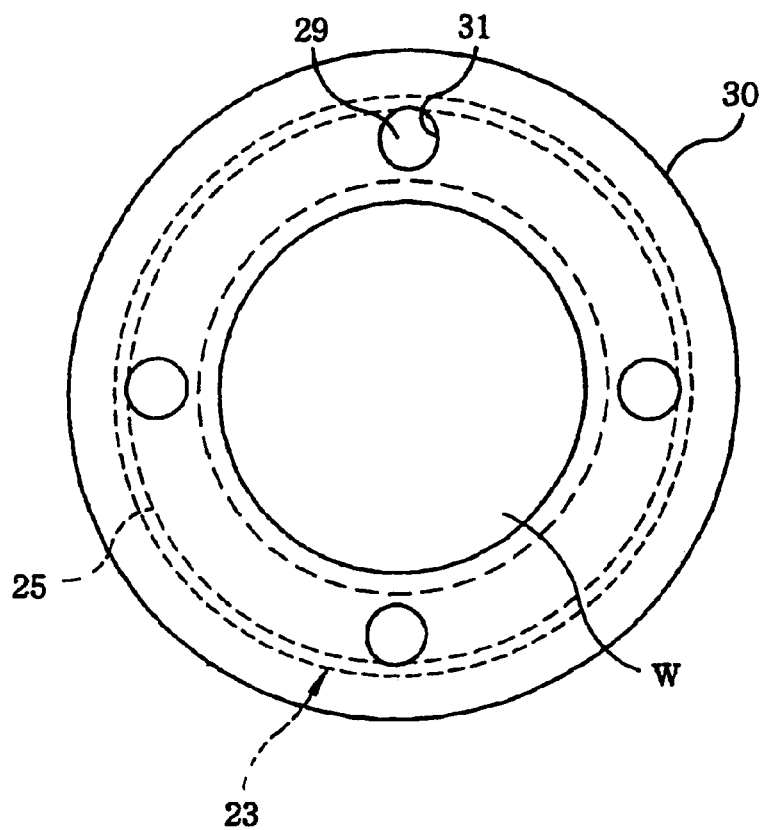
FIG. 5 offers a top view of the susceptor shown in FIG. 2 and its proximity.

Hereinafter, the structures of the susceptor 23 and its proximity will be described in detail. FIG. 4 is an enlarged cross sectional view of the suscepter 23 and its proximity, and FIG. 5 is a plan view thereof. As shown in FIGS. 4 and 5, formed on a top surface of the susceptor main body 27 is a recess 24 having a substantially the same shape as the wafer W to mount the wafer therein. Embedded below the recess 24 is the plate-shaped lower electrode 25 formed of a mesh shape and made of a metal, e.g., Mo, W or an alloy thereof, and embedded under the lower electrode 25 is the heating unit 26. Around a periphery of the recess 24 on an upper portion of the susceptor main body 27, there are provided four holes 28, extending to the lower electrode 25, the holes 28 being nearly equi-distanced at four locations along a circle substantially concentric with respect to the recess 24. In each of the four holes 28, an exposed electrode 29 made of a metal, e.g., Ti, is located to be electrically connected to the lower electrode 25 (see FIG. 5). The exposed electrode 29 is installed to measure the self-bias voltage of the lower electrode 25. And, there is provided a self-bias voltage measurement circuit 90 extending from the plasma to the matching unit 38 via the exposed electrode 29. The self-bias voltage measurement circuit 90 will be described later in detail.

A top surface of the exposed electrode 29 is disposed to be lower than that of the susceptor main body 27. Under such configuration, the exposed electrode 29 is prevented from being sputtered, and the wafer W is also prevented from being contaminated. The top surface of the exposed electrode 29 may be leveled with that of the susceptor main body 27. Though there is no restriction on the diameter of the holes 28, an excessively small diameter thereof makes it difficult to measure the self-bias voltage, while an excessively large diameter causes the exposed electrode 29 to be sputtered so that the wafer W is contaminated. Accordingly, it is preferable to set the diameter of the holes 28 to be within the range from 0.1 to 10 mm. More preferably, the diameter is to be within the range from 0.5 to 5 mm. Though the exposed electrode 29 is preferably of a circular shape, it is not limited to such shape. For example, it may have a rectangular, a triangular, an elliptical and a quadrilateral shape. Further, the location of the exposed electrode 29 is not limited to the upper surface of the susceptor main body 27 and it can be a side surface or lower surface of the susceptor main body 27 or a side surface of the supporting member 32.

Furthermore, the shadow ring 30 is provided with through holes 31 vertically extending therethrough at positions corresponding to the holes 28 formed in the susceptor 23. The exposed electrodes 29 disposed in the holes 28 are exposed to the plasma in the processing container 20 via the through holes 31.

Figure 6:
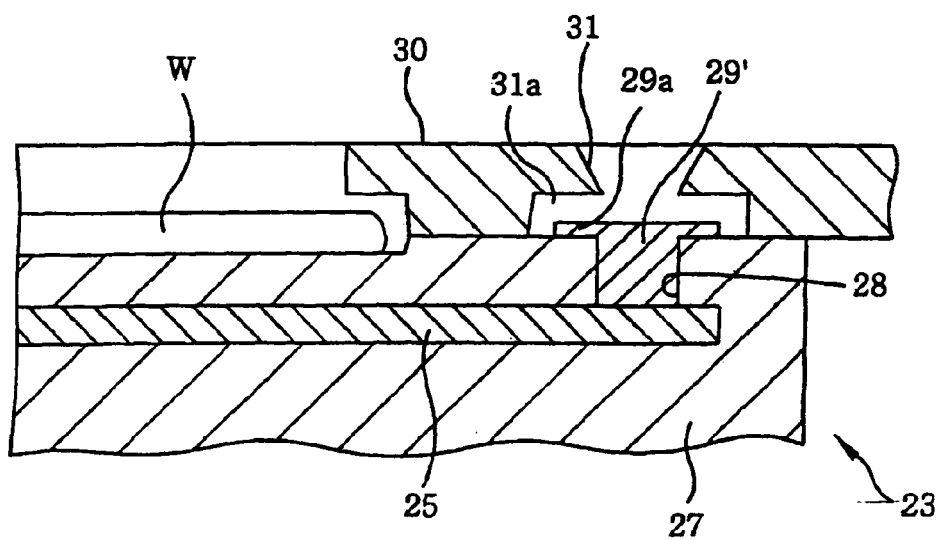
FIG. 6 provides an enlarged cross sectional view of a susceptor and its proximity to illustrate a modified example of an exposed electrode and a shadow ring.

Further, in a case of the shadow ring 30 not having a high positioning accuracy, there may be a problem of not being able to measure the self-bias voltage accurately because the through holes 31 of the shadow ring 30 do not accurately coincide with the exposed electrodes 29. To avoid such problem, it is preferable to install an exposed electrode 29' having a crest 29a wider than the hole 28 on an upper portion of the exposed electrode 29; and a countersink 31a, a width of which is wider than that of the crest 29a of the exposed electrode 29', at a lower part of the through holes 31 of the shadow ring 30, as shown in FIG. 6. Under such configuration, even in a case where the shadow ring 30 is somewhat misplaced, the exposed electrode 29' can be surely placed under the through hole 31 and the self-bias voltage can be accurately measured.

Hereinafter, there will be described an etching process to remove native oxide film formed on the wafer W by the pre-cleaning device 15 configured as described above.

First, the gate valve 48 is opened and the wafer W is carried into the chamber 21 by the transfer arm 19 installed in the transfer chamber 10 of the metal film formation system 1. With the shadow ring 30 raised, the wafer W is then placed on the wafer supporting pins (not shown) projected from the susceptor 23. Subsequently, the wafer supporting pins and the shadow ring 30 are lowered, so that the wafer W is mounted on the susceptor 23 and the outer peripheral portion of the wafer W is masked by the shadow ring 30. Then the gate valve 48 is closed, and the processing container 20 is evacuated in a predetermined depressurized state by the gas exhaust unit 51 and then the Ar gas and the $H_2$ gas are introduced into the processing container 20 from the Ar gas feed source 61 and the $H_2$ gas feed source 62 at predetermined flow rates, respectively, and the high frequency power from the high frequency power supply 44 is supplied to the coil 42, so that the inducted electromagnetic field is formed within the bell jar 22 to thereby generate therein the plasma of the gases and active ion and radicals. At the same time, the high frequency power is supplied to the lower electrode 25 of the susceptor 23 from the high frequency power supply 39. Then, the self-bias voltage applied to the lower electrode 25 causes the ions in the plasma to impinge onto the wafer W, so that the native oxide film on the wafer W is etched away. The temperature of the wafer W during the etching process is maintained in a range from 200 to 500° C. by the heating unit 26.

During such process, the self-bias voltage greatly influences the incidence angle, energy and the like of the ions impinging onto the wafer W. An excessively high self-bias voltage damages the surface of the wafer, whereas an excessively low voltage causes the ionic operation to be insufficient. Accordingly, in the preferred embodiment of the present invention, there is provided the self-bias voltage measurement circuit 90 for measuring the self-bias voltage of the lower electrode 25 based on the current flowing from the plasma through the exposed electrodes 29, 29'.

Figure 7:
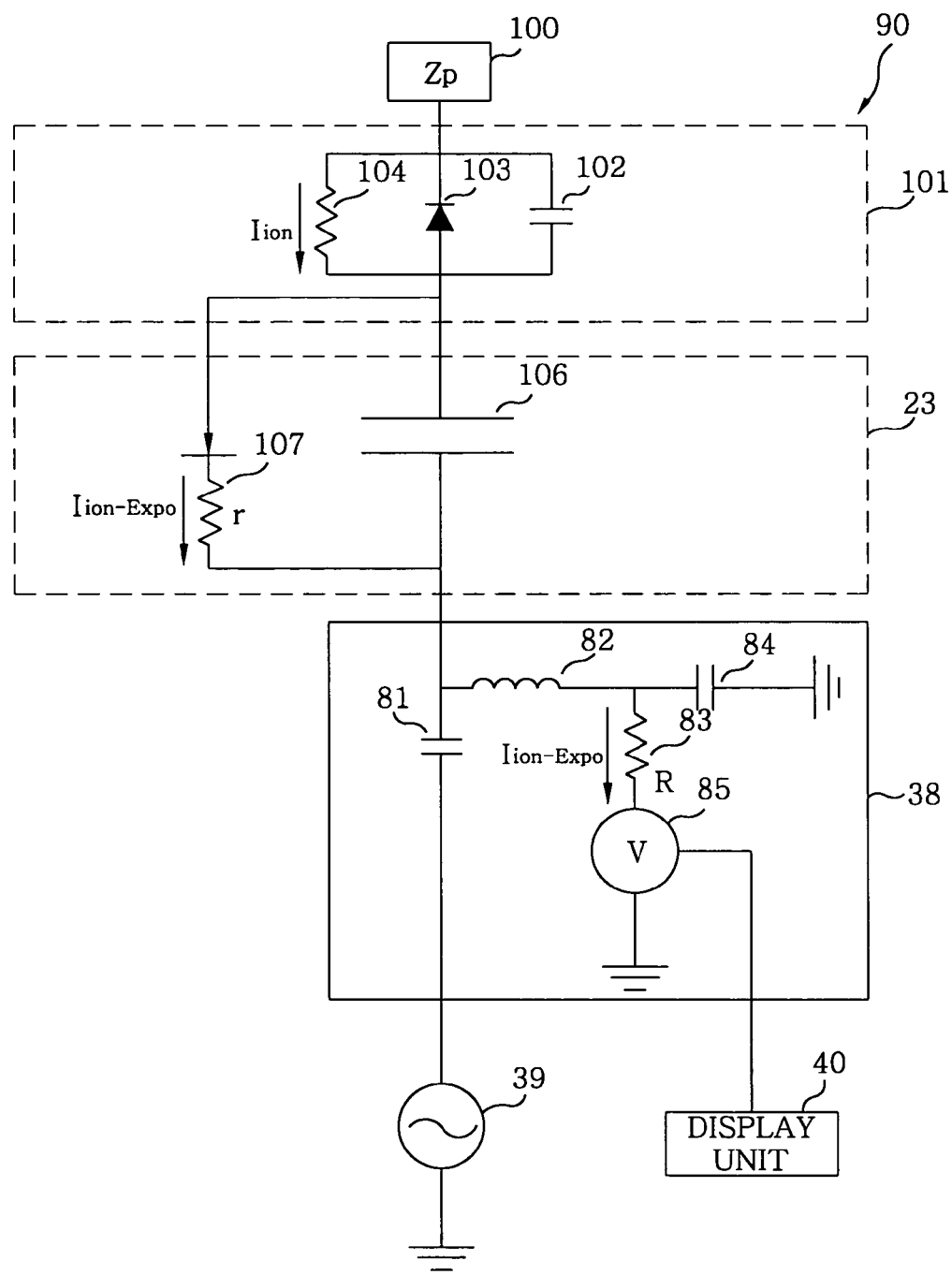
FIG. 7 presents a circuit diagram describing an equivalent circuit in which a pre-cleaning is performed by the pre-cleaning device shown in FIG. 2.

FIG. 7 is a circuit diagram showing an equivalent circuit of the plasma 100, a plasma sheath 101, the susceptor 23, the matching unit 38 and the high frequency power supply 39, by which circuit the self-bias voltage measurement circuit 90 is constituted, while performing the plasma etching by the pre-cleaning device 15. As illustrated in FIG. 7, the equivalent circuit includes the plasma 100 of a plasma impedance (Zp); a plasma sheath 101 connected to the plasma 100 in series and formed at the an interface between the susceptor 23 and the plasma 100; the susceptor 23 connected to the plasma sheath 101 in series; and the matching unit 38; and the high frequency power supply 39 described above. The plasma sheath 101 is depicted as a circuit which includes a capacitor 102 for indicating a capacitance for the sheath part; a diode 103 for indicating that the current flow is restricted by the interface; and a resistor 104 representing a resistance experienced by the ions due to the sheath part, which all are connected in parallel. And, the susceptor 23 is illustrated as a circuit which includes a capacitor 106 formed by the plasma 100, the lower electrode 25 and the susceptor main body 27 interposed therebetween; and a resistor 107 indicting the exposed electrodes 29, which are connected in parallel.

Under such configuration, an ion current $I_{ion}$ flows through the resistor 104 of the plasma sheath 101. In the susceptor 23, a high frequency component of the current flows through the capacitor 106, while a DC ion current $I_{ion-Expo}$ flows through the resistor 107, corresponding to the exposed electrodes 29, connected to the capacitor 106 in parallel so that the high frequency component and the DC ion current $I_{ion-Expo}$ are mixed. The mixed current of the high frequency component and the DC ion current $I_{ion-Expo}$ flows to the matching unit 38, wherein the DC ion current $I_{ion-Expo}$ is extracted by the coil 82 which cuts the high frequency component and, further, the self-bias voltage $V_{DCExpo}$ generated in the exposed electrodes 29 is measured by the voltmeter 85, and the measured self-bias voltage $V_{DCExpo}$ is displayed on the display unit 40.

If the total area of a top surface of the exposed electrodes 29 is $A_1$, the DC ion current $I_{ion-Expo}$ can be represented as $I_{ion-Expo}=en_s u_B A_1$, wherein $n_s$ is an ion density in an end portion of the plasma sheath; and $u_B$ is a Bohm velocity of the ions. In a similar manner as the above, if the total area of the lower electrode 25 is $A_2$, a current $I_{ion-electrode}$ flowing through the electrode 25 may be represented as $I_{ion-electrode}=en_s u_B A_2$. In other words, the current $I_{ion-electrode}=(A_2/A_1) I_{ion-Expo}$. On the other hand, if representing the resistance of the resistor 107 by r and the resistance of the resistor 83 by R, the self-bias voltage $V_{DCExpo}$ generated in the exposed electrodes 29 can be expressed by $V_{DCExpo}=(r+R)I_{ion-Expo}$. If R is much larger than r, $V_{DCExpo}$ approximately equals $RI_{ion-Expo}$, i.e., $V_{DCExpo} \cong RI_{ion-Expo}$. Moreover, in a similar fashion, the self-bias voltage $V_{DCelectrode}$ generated in the lower electrode 25 can be expressed as $V_{DCelectrode}=RI_{ion-electrode}$. Accordingly, it follows that $V_{DCelectrode}=R \times (A_2/A_1)V_{DCExpo}/R=(A_2/A_1)V_{DCExpo}$.

As shown above, the self-bias voltage $V_{DCExpo}$ generated at the exposed electrodes 29 can be measured by the self-bias voltage measurement circuit 90 and the measured self-bias voltage $V_{DCExpo}$ is displayed on the display unit 40. Further, by multiplying the measured self-bias voltage $V_{DCExpo}$ by the coefficient $A_2/A_1$, the self-bias voltage $V_{DCelectrode}$ generated in the lower electrode 25 can also be obtained in real time. An operation unit may be used to directly display the self-bias voltage $V_{DCelectrode}$.

In accordance with embodiment of the present embodiment, the self-bias voltage of the lower electrode 25 can be measured via the exposed electrode 29 while the plasma is generated. Therefore, by controlling the output of the high frequency power supply 39 to obtain a desired self-bias voltage, the pre-cleaning process using the plasma can be executed properly without damaging the wafer W. Accordingly, damaged layers and the native oxide layers formed on metal and metal silicide films, such as $CoSi_2$ film, WSi film, W film, Cu film, TiSi film, TiN film, TaN film, NiSi film, and MoSi film, and other various kinds of films formed on the wafer W can be removed properly, wherein the damaged layers and the native oxide layers can be formed such films which are exposed to the atmosphere, etched or CMP-processed.

While performing a pre-cleaning process under such arrangement, the self-bias voltage of the lower electrode 25 can be detected in real time to adjust the output of the high frequency power supply 39 such that the self-bias voltage becomes appropriate. Alternatively, a dummy wafer may be employed to obtain a relationship between the high frequency power output and the self-bias voltage of the lower electrode 25 and that between the self-bias voltage of the lower electrode 25 and etching property, e.g., an etching rate during the pre-cleaning process. And then the self-bias voltage appropriate to properly performing the etching can be derived from the relationships to thereby set the output of the high frequency power 39 capable of providing such proper self-bias voltage and then the actual pre-cleaning process can be performed. By performing the pre-cleaning process in an above-described manner, damaged layers and native oxide layers formed on metal and metal silicide films such as $CoSi_2$ film, WSi film, W film, Cu film, TiSi film, TiN film, TaN film, NiSi film and MoSi film, and other various kinds of films when such films are exposed to the atmosphere, etched, or CMP-processed can be removed properly. Moreover, when the self-bias voltage of the lower electrode 25 measured in an above-described manner falls outside the proper range, the wafer W processed under such condition can be determined as defective.

Upon completion of the pre-cleaning process as described above by using the plasma, the processing container 20 is set to have the same vacuum level as the transfer chamber 10 by controlling a gas pumping rate of the gas exhaust unit 51 and the supply rate of the gases from the Ar and the $H_2$ gas feed source 61, 62, respectively; and, at the same time, the wafer supporting pins are projected from the susceptor 23 to raise the wafer W and the gate valve 48 is opened. Then the transfer arm 19 is introduced into the chamber 21 to take out the wafer W, so that the process in the pre-cleaning device 15 is completed.

In the preferred embodiment described above, the pre-cleaning device employs an inductively coupled plasma where the plasma density and the self-bias voltage can be independently controlled and a low bias voltage with a higher plasma density can be obtained, and the self-bias voltage of the lower electrode is measured to appropriately control the impinging of the ions during the pre-cleaning of a wafer W. Therefore, the native oxide film can be removed with a high efficiency without damaging the wafer W.

Next, the measurement result of the self-bias voltage taken during the pre-cleaning process described above by using the pre-cleaning device 15 in accordance with the preferred embodiment will be described in detail.

Figure 8:
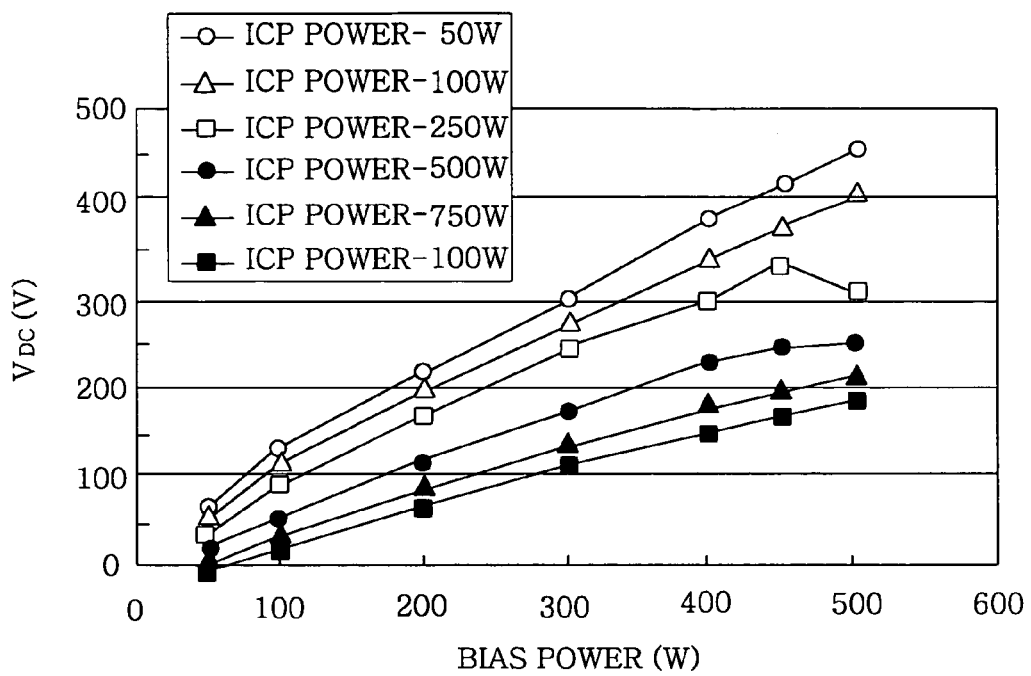
FIG. 8 depicts a graph showing a relationship between an output of a high frequency power supply applied to a lower electrode and a measured self-bias voltage.

FIG. 8 is a graph showing a relationship between an output of the high frequency power supply 39 (shown as bias power in FIGS. 8 and 9) and a measured self-bias voltage (shown as $V_{DC}$ in FIGS. 8 and 9), wherein the output of the high frequency power supply 44 (shown as ICP power in FIGS. 8 and 9) was varied to 50 W, 100 W, 250 W, 500 W, 750 W and 1000 W and, for each output of the high frequency power supply 44, the output of the high frequency power supply 39 was varied from 100 W to 500 W under the process condition as follows. The pressure in the processing container 20: 66.5 mPa (0.5 mTorr); the heating temperature of the heating unit 26: 200° C.; and the flow rate of the processing gas: Ar gas 0.003 L/min (3 sccm).

Figure 9:
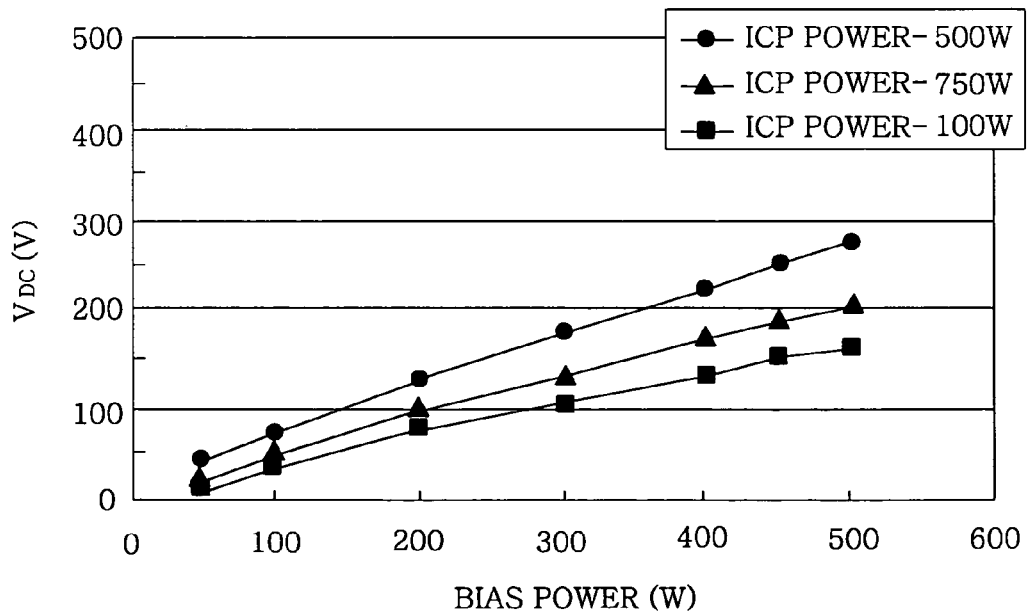
FIG. 9 describes a graph showing a relationship between the output of the high frequency power supply applied to the lower electrode and the measured self-bias voltage under a different processing condition.

FIG. 9 also shows the relationship between the output of the high frequency power supply 39 and the measured self-bias voltage, wherein, for each output of the high frequency power supply 44, the output of the high frequency power supply 39 was varied under the process condition as follows. The pressure in the processing container 20: 66.5 mPa (0.5 mTorr); the heating temperature of the heating unit 26: 200° C.; and the flow rate of the processing gas: Ar gas 0.008 L/min (8 sccm) and $H_2$ gas 0.012 L/min(12 sccm).

As shown in FIGS. 8 and 9, the relationship between the self-bias voltage and the output of the high frequency power supply 39, for each output of the high frequency power supply

44, is linear; but, the slopes of the respective lines vary depending on outputs of the high frequency power supply 44.

Furthermore, the relationship between the output of the high frequency power supply 39 and the self-bias voltage were repeatedly examined three times under the process condition where the pressure in the processing container 20: 66.5 mPa (0.5 mTorr); the heating temperature of the heating unit 26: 200° C.; the flow rate of the processing gas: Ar gas 0.003 L/min (3 sccm); and the output of the high frequency power supply 44: 500 W. All the three examination results were identical to the case illustrated in FIG. 8. Thus, such results illustrate the high reproducibility and reliability in the measurement of the self-bias voltage taken in the preferred embodiment.

Hereinafter, a relationship between the measured self-bias voltage and an etching rate/an etching uniformity in accordance with the preferred embodiment will be described in detail.

Figure 10:
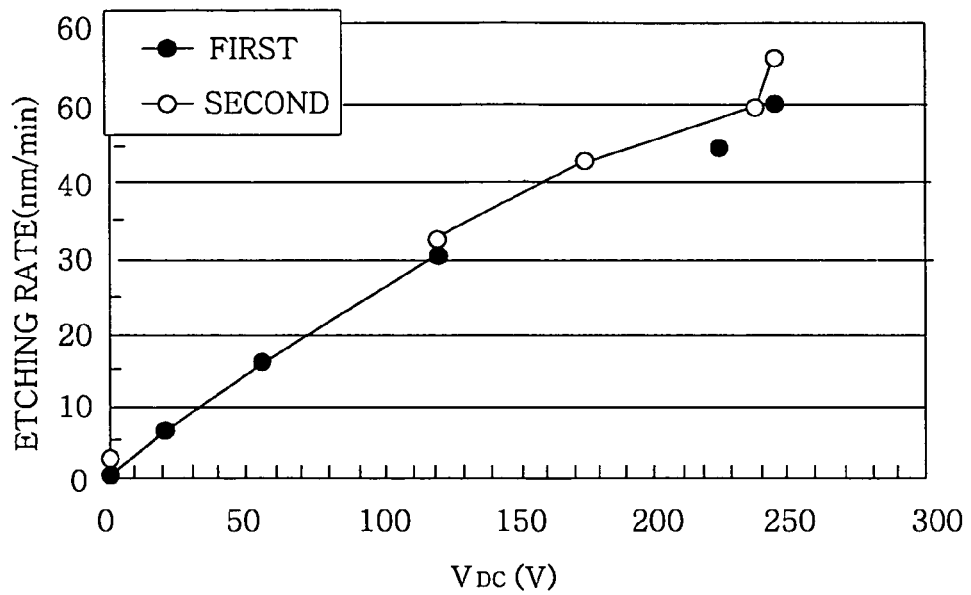
FIG. 10 shows a graph showing a relationship between the self-bias voltage and an etching rate.

FIG. 10 is a graph showing a relationship between the self-bias voltage and the etching rate while the pre-cleaning process was repeated twice with various self-bias voltages generated by changing the output of the high frequency power supply 39 under the process condition as follows. The pressure in the processing container 20: 66.5 mPa (0.5 mTorr); the heating temperature of the heating unit 26: 200° C.; the flow rate of the processing gas: Ar gas 0.003 L/min (3 sccm); the output of the high frequency power supply 44: 500 W; and the processing time: 30 seconds. As illustrated in FIG. 10, it can be seen that the etching rate is proportional to the self-bias voltage and, therefore, the etching rate can be controlled by controlling the self-bias voltage.

Figure 11:
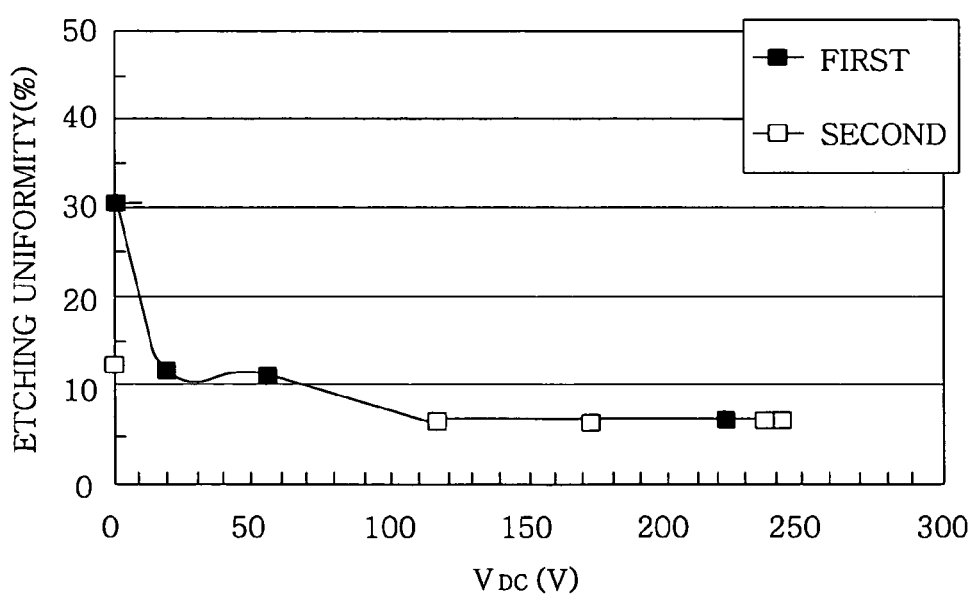
FIG. 11 sets forth a graph illustrating a relationship between the self-bias voltage and an etching uniformity.

Further, a maximum (max), a minimum (min) and an average (Ave) of etched amount in each of the first and the second pre-cleaning process were obtained to estimate the etching uniformity by $\{(max-min)/2 \times Ave\}\} \times 100(\%)$. FIG. 11 shows the relationship between the self-bias voltage and the etching uniformity, in which the x-axis represents the self-bias voltage and the y-axis represents an estimated etching uniformity. From FIG. 11, it can be seen that the high etching uniformity is obtained by increasing the self-bias voltage. Further, the reproducibility of the estimated etching uniformity in the first and the second pre-cleaning process for each self-bias voltage shows that there is a difference in the estimated etching uniformity at 0 V of the self-bias voltage; but, if the self-bias voltage is equal to or greater than 20 V, a high reproducibility can be obtained to realize a high etching uniformity. Accordingly, the high etching uniformity can be achieved by maintaining the self-bias voltage at a level equal to or greater than 20 V. It is more preferable that the self-bias voltage is equal to or greater than 50 V.

As described above, it has been found that the etching rate and etching uniformity during the pre-cleaning process are closely related to the self-bias voltage and, thus, the etching rate and the etching uniformity can be controlled as desired by measuring the self-bias voltage and controlling a value thereof to a desired level.

Hereinafter, another preferred embodiment of the present invention will be describe.

Figure 12:
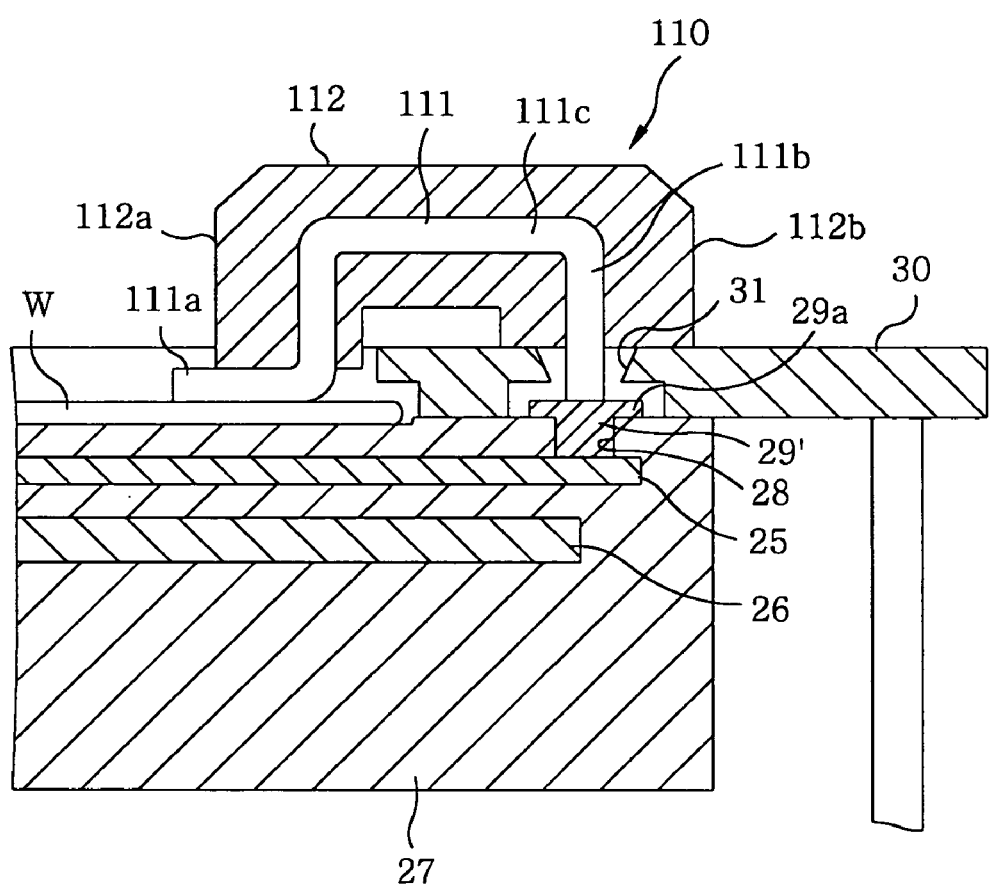
FIG. 12 illustrates a cross sectional view of a susceptor illustrated in FIG. 6, having a measuring jig mounted thereon.
Figure 13:
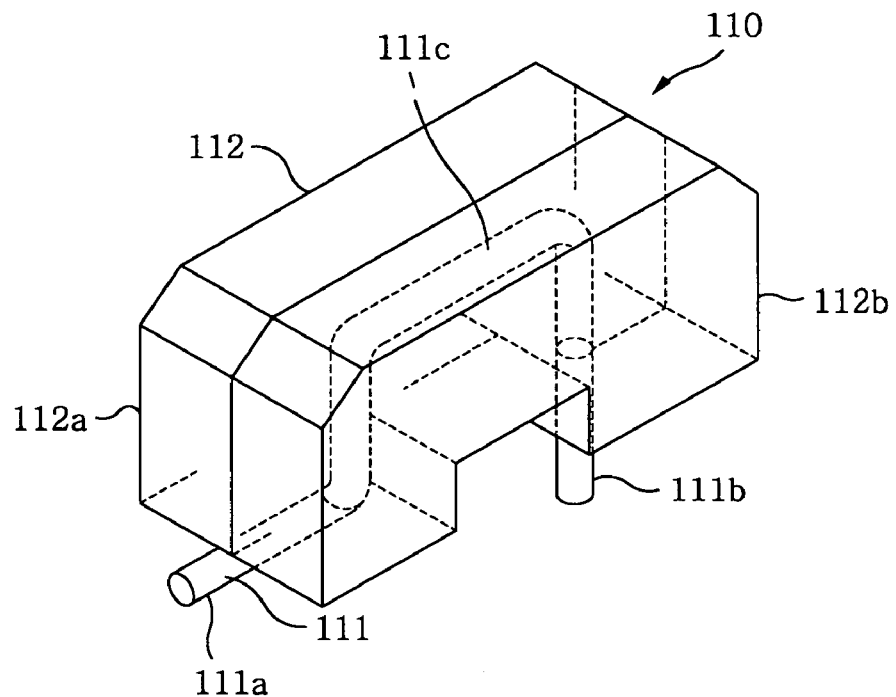
FIG. 13 offers a perspective view of the measuring jig of FIG. 12.

In the present embodiment, a measuring jig is further installed to the same pre-cleaning device incorporating therein the exposed electrodes of the previous embodiment to enable the measurement of the self-bias voltage on a surface of the wafer. FIG. 12 is a cross sectional view illustrating the measuring jig in accordance with the present embodiment installed on a part of the susceptor shown in FIG. 6, whereas FIG. 13 is a perspective view of the measuring jig used in the present invention. Other parts of the pre-cleaning device in the present embodiment are the same as those in the previous embodiment.

As shown in FIG. 12, a measuring jig 110 is disposed to cover the periphery portion of the wafer W and a portion of the through hole 31 in the shadow ring 30. The measuring jig 110 can be detachably attached, so that it can be attached while the self-bias voltage is measured and it may be detached during the actual etching process. The measuring jig 110 includes an electrode 111 connecting a surface of the wafer W to the exposed electrode 29' and a casing 112 for accommodating therein and protecting the electrode 111. The electrode 111 is fixed while being inserted into the casing 112.

The electrode 111 has a shape of a curved rod and includes a wafer contact portion 111a exposed through a lower part of the casing 112 and horizontally disposed on a surface of the wafer W; an exposed electrode contact portion 111b extending from a region above the shadow ring 30 to the exposed electrode 29' through the through hole 31; and a intermediate portion 111c disposed therebetween. The intermediate portion 111c is bent not to be in contact with the shadow ring 30. The preferred material of the electrode 111 is Ti, but is not limited thereto.

The casing 112 is formed to cover the electrode 111. As shown in FIG. 13, the electrode 111 is inserted in the casing 112 and then segmented portions of the casing 112 bisected along the electrode 111 are welded or thermally bonded together, so that a major part of the electrode 111 is shielded by the casing 112 excepting the exposed portions. Accordingly, the measurements can be made a lot more precise. The casing 112 includes a wafer side portion 112a corresponding to the wafer contact portion 111a of the electrode 111; and a shadow ring side portion 112b placed on the shadow ring 30. The casing 112 is made of a plasma resistant material, e.g., quartz.

By using such measuring jig 110, the self-bias voltage can be measured from a plasma at a position on the wafer W, at which the self-bias voltage needs to be detected, via the electrode 111 and the exposed electrode 29'. Thus, under such arrangement, while yielding high accuracy of measurement, a reference self-bias voltage, which is used as a reference of the self-bias voltage obtained from the electrode near the wafer, can be obtained. In such a case, the self-bias voltage of the lower electrode can be estimated in a similar manner as in the method described with reference to FIG. 7.

Next, experiment results comparing two cases are described, wherein in one case, the measuring jig 110 was used and in the other case only the exposed electrode was used without employing the measuring jig 110 are described.

Figure 14:
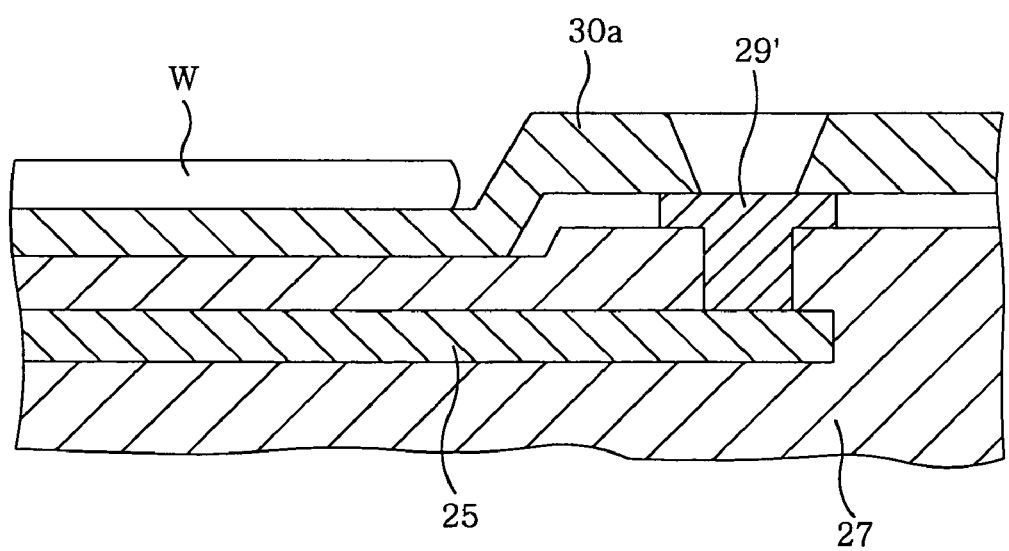
FIG. 14 provides a cross sectional view of a quartz mask placed on a susceptor main body and around the wafer.

In a certain part of the experiment, the wafer W was mounted on the susceptor main body 27 made of AlN and a shadow ring 30 was used, as in the above embodiment; and in the remaining part of the experiment, instead of using the shadow ring 30, a quartz mask 30a was used on the susceptor main body 27 and around the wafer W as shown in FIG. 14.

Figure 15:
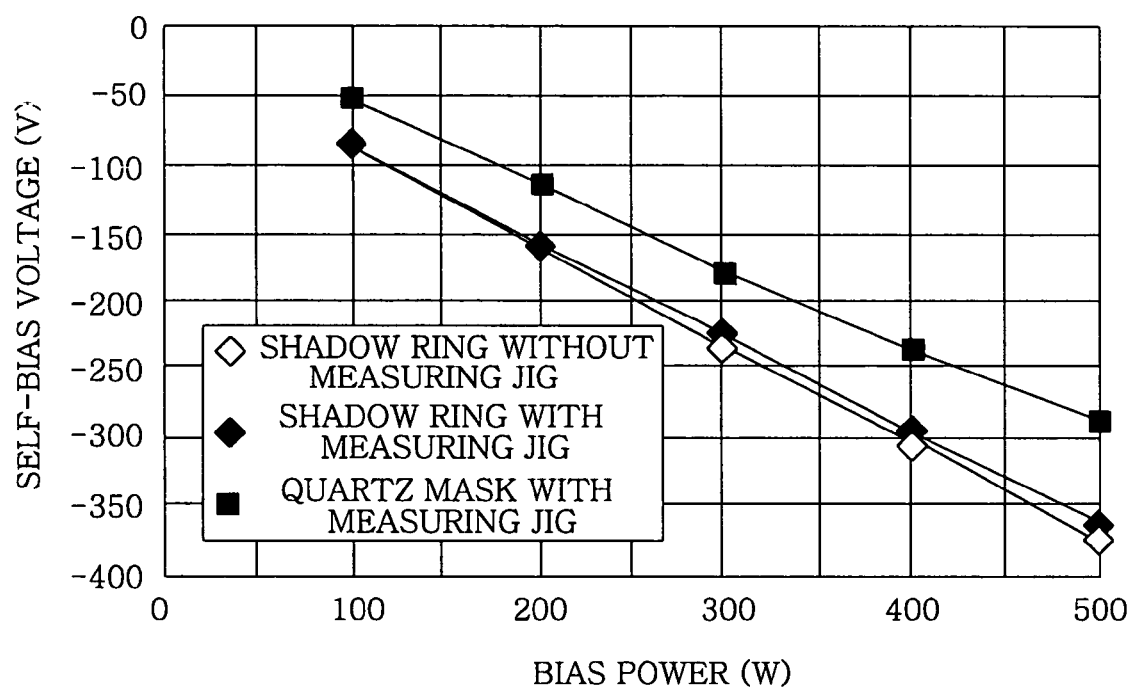
FIG. 15 is a graph illustrating a relationship between a bias power and the self-bias voltage.

FIG. 15 is a graph showing a relationship between the bias power of the high frequency power supply 39 and the measured self-bias voltage when the pressure of the processing container 20 was 66.5 mPa (0.5 mTorr); and the output of the high frequency power supply 44 for generating the inductively coupled plasma was 500 W. As shown in FIG. 15, the relationship conforms to approximately a straight line in respective cases. Further, in the cases of mounting the wafer W directly on the susceptor main body 27 made of AlN while using the shadow ring 30, almost the same relationships were obtained irrespective of whether or not using the measuring jig. However, in the case of using the quartz mask, it has been found that the absolute value of the self-bias voltage was reduced for a bias power.

Figure 16:
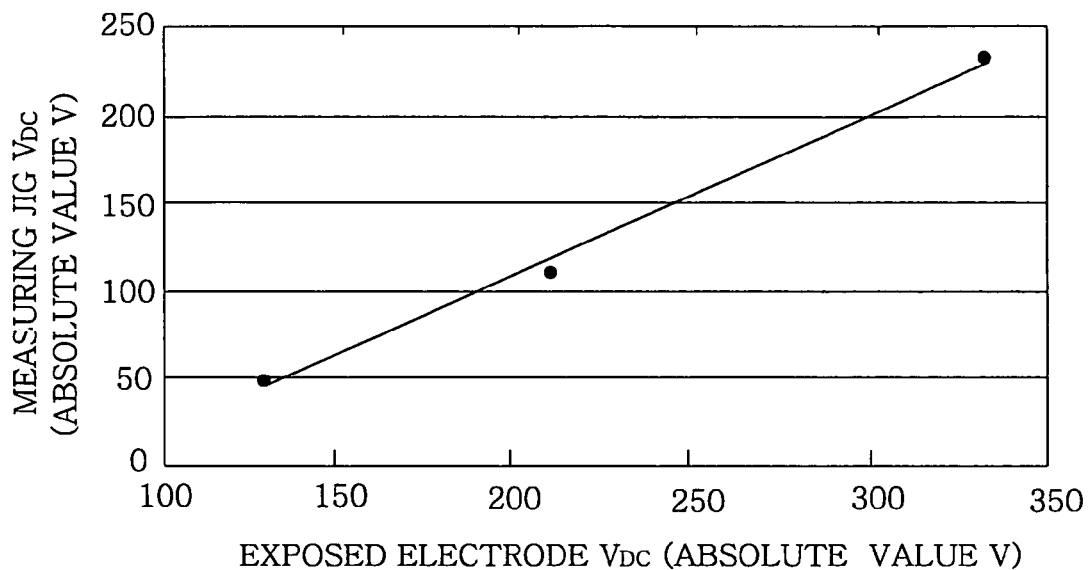
FIG. 16 shows the self-bias voltage with and without the measuring jig.

FIG. 16 represent a graph showing a relationship between an exposed electrode $V_{DC}$ and an measuring jig $V_{DC}$ in a case of using the quartz mask 30a. In FIG. 16, the x-axis represents the exposed electrode $V_{DC}$, which is a self-bias voltage measured when the exposed electrode 29' was used without using the measuring jig 110; and the y-axis represents the measuring jig $V_{DC}$, which is a self-bias voltage at the position of the wafer when the measuring jig 110 was used. As shown in FIG. 16, there is a linear relationship therebetween. Accordingly, from the self-bias voltage obtained from the exposed electrode, which can be monitored all the time, the self-bias voltage at the actual position of the wafer can be obtained.

Figure 17:
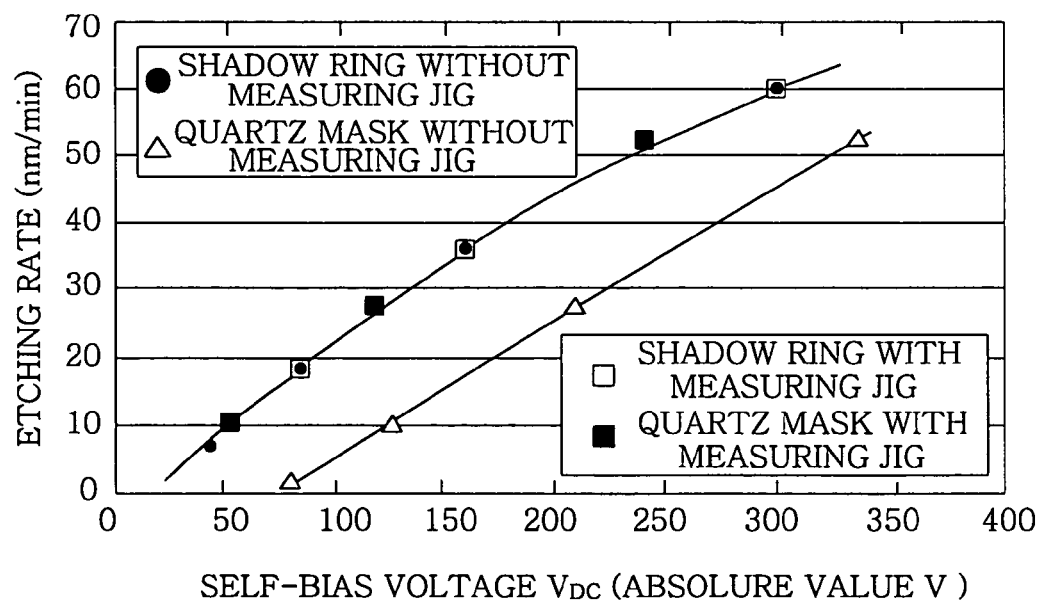
FIG. 17 describes a graph showing a relationship between the self-bias voltage and the etching rate, with and without the measuring jig.

FIG. 17 is a graph showing a relationship between the measured self-bias voltage and the etching rate for the cases of using the shadow mask 30 and the quartz mask 30a while mounting the wafer W directly on the susceptor main body 27 made of AlN, with and without using the measuring jig 110 for each case. Herein, the self-bias voltage was varied by adjusting the bias power of the high frequency power supply 39 under the process condition where the pressure in the processing container 20: 66.5 mPa (0.5 mTorr); the heating temperature of the heating unit 26: 200° C.; the flow rate of the processing gas: Ar gas 0.003 L/min (3 sccm); and the output of the high frequency power supply 44 for generating the inductively coupled plasma: 500 W. As illustrated in the drawing, the case of mounting the wafer W directly on the susceptor main body 27 made of AlN while using the shadow ring 30, almost the same relationships were obtained irrespective of whether or not using the measuring jig 110. Moreover, in case of measuring the self-bias voltage at the position of the wafer through the use of the measuring jig 110, almost the same relationships were obtained irrespectively whether or not using the quartz mask 30a. However, when the measuring jig was not used, quite different results were obtained depending on whether the quartz mask 30a was used or not. In other words, in case of measuring the self-bias voltage at the position of the wafer W, the relationship between the self-bias voltage and the etching rate does not depend on a base of the wafer W, while, in case of not using the measuring jig, the base of the wafer W affects the relationship therebetween.

Further, the present invention may be tailored to other variations, and is not limited to the above-described embodiments. For example, in the above embodiment, the susceptor main body 27 was made of a ceramic such as AlN or $Al_2O_3$; and the shadow ring 30 was made of quartz or AlN, but the susceptor main body 27 may be made of quartz, SiC, $Si_3N_4$ or the like and the shadow ring 30 may be made of $Al_2O_3$, SiC, $Si_3N_4$ or the like. Since, however, Al is sputtered in case of using these members made of an Al-containing material and Si is sputtered in case of using SiC and $Si_3N_4$, it is preferable to use quartz. Furthermore, the exposed electrode 29 sputtered by plasma was made of Ti in accordance with the above embodiment of the present invention since in the metal film formation system 1 the Ti film formation is performed by the Ti film formation device 14 after pre-cleaning. However, the exposed electrode 29 may be made of any one of W, Co, Cu, Ni, Ta, SiC, and Mo, depending on the film formation process executed after the pre-cleaning. Moreover, the susceptor 23 in the present invention is not limited to the configuration in the preferred embodiments. For example, it may have a structure that only the upper surface of the electrode is coated with an insulator. In the above-described preferred embodiments, the exposed electrode 29 was installed separately from the lower electrode 25. However, instead of installing the exposed electrode separately, the lower electrode 25 can be made to be exposed at a bottom portion of the hole 28 provided in the susceptor main body 27 so that the exposed portion of the lower electrode 25 can function as the exposed electrode.

In addition, even though Ar was used as a noble gas in the preferred embodiment of the present invention, the noble gas is not limited thereto but Ne and He may be used therefor. The measuring jig is not limited to the above shape.

Furthermore, the present invention was applied to the pre-cleaning device 15 mounted in the metal film formation system 1 in the preferred embodiments, but the present invention can also be applied to conventional plasma etching apparatus, plasma CVD film formation apparatus, plasma ashing apparatus or the like. Also, the plasma is not limited to the inductively coupled plasma described above, and a capacitively coupled plasma may also be used. Moreover, even though in the above embodiment a semiconductor wafer was used as the substrate to be processed, other substrates, e.g., a glass substrate for a liquid crystal display, may also be used.

As described above, in accordance with the present invention, since there is provided an exposed electrode connected to a high frequency electrode, the exposed electrode can be brought into contact with the plasma during the plasma processing of a substrate to be processed mounted on the substrate mounting table whose surface is made of the insulator, and thus the self-bias voltage of the high frequency electrode may be measured. Specifically, the self-bias voltage measurement circuit provided to measure the self-bias voltage of the plasma from the current flowing from the plasma generated in the processing container via the exposed electrode enables the measurement of the self-bias voltage of the high frequency electrode from the current flowing from the plasma via the exposed electrode. Accordingly, the implementation of the plasma processing apparatus and the substrate mounting table for use therein can be accomplished, the apparatus being capable of conducting the plasma processing while measuring the self-bias voltage by using the substrate mounting table whose surface is coated with the insulator.

What is claimed is:

1. A plasma processing apparatus comprising:
a processing container for receiving a substrate to be processed and processing the substrate by a plasma of a processing gas;
a substrate mounting table for mounting the substrate thereon, the substrate mounting table being made of a ceramic;
a gas supplying unit for supplying the processing gas into the processing container,
a first electrode embedded inside the substrate mounting table;
a heating unit embedded in the substrate mounting table and disposed under the first electrode;
a high frequency power supply for supplying a high frequency power connected to the electrode; and
one or more exposed second electrodes, wherein each of the second electrodes is installed in a hole of the substrate mounting table to be electrically directly connected to the first electrode through the hole and the second electrodes are exposed toward the outside of the substrate mounting table,
wherein an annular ring for covering an edge of the substrate to be processed is disposed above the substrate mounting table,
wherein one or more through holes are formed in the ring at positions corresponding to the second electrodes, a top surface of each of the second electrodes is lower than a top surface of the ring, and one or more countersinks are formed at lower parts of the through and wherein the second electrodes are exposed to the plasma in the processing container via the through holes.

2. The plasma processing apparatus of claim 1, further comprising a self-bias voltage measuring circuit for measuring a self-bias voltage of the plasma from a current flowing by the plasma formed in the processing container via the second electrodes installed at the substrate mounting table, wherein the self-bias voltage measuring circuit is constituted by an equivalent circuit including:
a plasma portion having a plasma impedance;
a mounting table portion;
a plasma sheath connected to the plasma portion in series and formed between the mounting table portion and the plasma portion; and
a matching unit.

3. The plasma processing apparatus of claim 2,
wherein the plasma sheath includes:
a capacitor; a diode for restricting a current flow by an interface; and
a first resistor whose resistance is experienced by ions due to the plasma sheath,
wherein the mounting table portion includes: a capacitor constituted by interposing the substrate mounting table between the plasma portion and the first electrode; and a second resistor due to the second electrodes, and
wherein the matching unit includes: a blocking capacitor, located between the first electrode and the high frequency power supply, for applying a floating potential to the first electrode; a coil for extracting a DC current component from a current from the first electrode, wherein one end of the coil is connected to a first electrode side of the blocking capacitor; a third resistor and a capacitor connected to the other end of the coil; and a voltmeter connected to the third resistor.

4. The plasma processing apparatus of claim 3, wherein a self-bias voltage $V_{DCExpo}$ generated at the second electrodes is measured by the voltmeter and represented as:

$V_{DCExpo} \approx R \cdot I_{ion\text{-}Expo}$, wherein R is a resistance of the third resistor, and $I_{ion\text{-}Expo}$ is a current flowing through the third resistor.

5. The plasma processing apparatus of claim 4, wherein a self-bias voltage $V_{DCelectrode}$ generated at the first electrode is represented as:

$V_{DCelectrode} = A_2/A_1 V_{DCExpo}$, wherein $A_1$ is a total area of a top surface of the second electrodes, and $A_2$ is a total area of a top surface of the first electrode.

6. The plasma processing apparatus of claim 1, further comprising:
an antenna, disposed outside the processing container, for forming an induced electromagnetic field within the processing container; and
a high frequency power supply for plasma for supplying a high frequency power to the antenna.

7. The plasma processing apparatus of claim 6, further comprising a circuit for extracting a DC current component from a current flowing via the second electrodes and the first electrode.

8. The plasma processing apparatus of claim 1, wherein surfaces of the second electrodes are leveled with or lower than a surface of the substrate mounting table.

9. The plasma processing apparatus of claim 1, wherein the second electrodes are made of one of Ti, SiC, W, Co, Cu, Ni, Mo and Ta.

10. The plasma processing apparatus of claim 1, wherein the second electrodes are disposed outside a periphery of the substrate mounted on the substrate mounting table.

11. The plasma processing apparatus of claim 10, wherein the second electrodes are installed at plural locations to be nearly equi-distanced along a circle.

12. The plasma processing apparatus of claim 1, wherein the ceramic is one of AlN, $Al_2O_3$ and SiC.

13. The plasma processing apparatus of claim 1, wherein said each of the second electrodes has a crest wider than the hole at the outside thereof.

14. The plasma processing apparatus of claim 13, wherein a width of each of the countersinks of the ring is wider than that of the crest of said each of the exposed electrodes.

15. The plasma processing apparatus of claim 1, wherein the processing container includes:
a first chamber with an opened upper portion; and
a second chamber having a bell jar installed above the first chamber and made of an insulating material.

16. The plasma processing apparatus of claim 15, wherein the insulating material is made of quartz or a ceramic material.

17. The plasma processing apparatus of claim 1, wherein the ring is made of one of quartz, AlN, $Al_2O_3$, SiC and $Si_3N_4$.

18. A substrate mounting table for mounting a substrate to be processed while performing a plasma processing thereon, comprising:
a mounting table main body made of a ceramic;
a high frequency electrode embedded inside the mounting table main body, to which high frequency power is applied;
a heating unit embedded in the mounting table main body and disposed under the high frequency electrode; and
one or more exposed electrode, wherein each of the exposed electrodes is installed in a hole of the mounting table to be electrically directly connected to the high frequency electrode through the hole and the exposed electrodes are exposed toward the outside of the mounting table;
wherein each of the exposed electrodes is installed in a hole of the mounting table main body and has a crest wider than the hole at the outside thereof;
wherein an annular ring for covering an edge of the substrate to be processed is disposed above the mounting table main body;
wherein one or more through holes are formed in the ring at positions corresponding to the exposed electrodes; and a top surface of each of the exposed electrodes is lower than a top surface of the ring, and one or more countersinks are formed at lower parts of the through holes; and
wherein the exposed electrodes are exposed to the plasma via the through holes.

19. The substrate mounting table of claim 18, further comprising a self-bias voltage measuring circuit for measuring a self-bias voltage of a plasma from a current flowing by the plasma via the exposed electrodes installed at the mounting table main body while performing the plasma processing on the substrate to be processed,
wherein the self-bias voltage measuring circuit is constituted by an equivalent circuit including:
a plasma portion having a plasma impedance;
a mounting table portion;

a plasma sheath connected to the plasma portion in series and formed between the mounting table portion and the plasma portion; and a matching unit.

20. The substrate mounting table of claim 19, wherein the plasma sheath includes:

a capacitor;

a diode for restricting a current flow by an interface; and a first resistor whose resistance is experienced by ions due to the plasma sheath, wherein the mounting table portion includes: a capacitor constituted by interposing the mounting table main body between the plasma portion and the electrode; and a second resistor due to the exposed electrodes, and wherein the matching unit includes: a blocking capacitor, located between the electrode and the high frequency power supply, for applying a floating potential to the electrode; a coil for extracting a DC current component from a current from the electrode, wherein one end of the coil is connected to an electrode side of the blocking capacitor; a third resistor and a capacitor connected to the other end of the coil; and a voltmeter connected to the third resistor.

21. The substrate mounting table of claim 18, wherein the exposed electrodes are made of a metal.

22. The substrate mounting table of claim 18, wherein the exposed electrodes are disposed outside a periphery of the substrate mounted on the substrate mounting table.

23. The substrate mounting table of claim 18, wherein the exposed electrodes are installed at plural locations to be nearly equi-distanced along a circle.

24. The substrate mounting table of claim 18, wherein the ceramic is one of AlN, $Al_2O_3$ and SiC.

* * * * *